United States Patent
Ogiwara et al.

(10) Patent No.: US 7,583,114 B2
(45) Date of Patent: Sep. 1, 2009

(54) SUPPLY VOLTAGE SENSING CIRCUIT

(75) Inventors: Ryu Ogiwara, Yokohama (JP);
Daisaburo Takashima, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 88 days.

(21) Appl. No.: 11/684,214

(22) Filed: Mar. 9, 2007

(65) Prior Publication Data

US 2007/0236260 A1 Oct. 11, 2007

(30) Foreign Application Priority Data

Apr. 6, 2006 (JP) ............................. 2006-105607

(51) Int. Cl.
*H03L 7/00* (2006.01)
(52) U.S. Cl. ...................... 327/142; 327/143
(58) Field of Classification Search ................. None
See application file for complete search history.

(56) References Cited

U.S. PATENT DOCUMENTS 4,119,904 A * 10/1978 Haglund ..................... 320/136

| | | | | |
|---|---|---|---|---|
| 6,815,941 B2 * | 11/2004 | Butler | ......................... | 323/313 |
| 6,853,221 B1 * | 2/2005 | Wert | ........................... | 327/143 |
| 7,106,188 B2 * | 9/2006 | Goggin et al. | ........... | 340/539.1 |
| 7,230,473 B2 * | 6/2007 | Tadeparthy et al. | ......... | 327/539 |

FOREIGN PATENT DOCUMENTS

JP 2002-300020 10/2002

* cited by examiner

*Primary Examiner*—Tuan Lam
*Assistant Examiner*—Hiep Nguyen
(74) *Attorney, Agent, or Firm*—Oblon, Spivak, McClelland, Maier & Neustadt, P.C.

(57) ABSTRACT

A supply voltage sensing circuit comprises an internal power supply circuit, which provides a constant output voltage regardless of the supply voltage. A delay circuit generates a delayed signal by delaying a variation in the output voltage. A divider circuit generates a divided voltage by dividing the supply voltage at a certain division ratio. A p-type MOS transistor has a source given the delayed signal and a gate given the divided voltage and turns on when the supply voltage lowers below a certain value. An output circuit provides an output voltage based on a drain voltage on the p-type MOS transistor.

8 Claims, 8 Drawing Sheets when (T=T1)

when (T=T2(> T1))

SUPPLY VOLTAGE SENSING CIRCUIT

CROSS REFERENCE TO RELATED APPLICATION

This application is based on and claims the benefit of priority from prior Japanese Patent Application No. 2006-105607, filed on Apr. 6, 2006, the entire contents of which are incorporated herein by reference.

BACKGROUND OF THE INVENTION

1. Field of the Invention

The present invention relates to a supply voltage sensing circuit for sensing a variation in supply voltage.

2. Description of the Related Art

A supply voltage sensing circuit is a circuit that senses a supply voltage and provides a detection signal when the supply voltage rises to a certain range and when it lowers to a certain range. The supply voltage sensing circuit is used in an SRAM, a DRAM, an EEPROM, an FeRAM (Ferroelectric Random Access Memory) and the like that require fast detection of a variation in supply voltage.

One of conventionally proposed supply voltage sensing circuits includes a p-type MOS transistor, which has a source supplied with the supply voltage, a drain grounded via a current control resistor, and a gate supplied with an output voltage from a divider circuit that resistance-divides the supply voltage. In this arrangement, when the supply voltage rises above a desired value, the p-type MOS transistor turns on and senses a rise in the supply voltage. On the other hand, when the supply voltage lowers below a desired value, the p-type MOS transistor turns off and senses a drop in the supply voltage.

In the supply voltage circuit thus configured, if the supply voltage drops slower compared to the RC time constant of the current control resistor and thus the RC time constant is negligible, the drop in the supply voltage can be sensed without problems. If the supply voltage drops faster compared to the RC time constant, a problem arises because the drop therein can not be sensed. Namely, when the supply voltage drops faster, the potential difference between the gate and the source of a p-type MOS transistor lowers below the threshold voltage to turn off the transistor. Even in such the case, the RC time constant prevents a drop in drain voltage. This is not transmitted to the following stage circuit and causes a problem because a drop in the supply voltage cannot be sensed.

To solve such the problem, JP 2002-300020A (FIG. 1 and paragraphs 0032-0044) discloses a supply voltage sensing circuit as known. The circuit includes a p-type MOS transistor having a source given the supply voltage via a RC delay circuit. In the sensing circuit, when the supply voltage drops, the gate voltage lowers while the source voltage lowers with delay because of the presence of the RC delay circuit. Therefore, when the supply voltage lowers below a certain value, the p-type MOS transistor turns on. Sensing the p-type MOS transistor being turned on enables a drop in the supply voltage to be sensed. As for a rise in the supply voltage, the above conventional circuit is separately provided in parallel for detection. In the circuit of JP 2002-300020A, the CR time constant of the current control resistor connected between the drain of the p-type MOS transistor and the ground terminal cannot affect thereon and accordingly a fast drop in the supply voltage can be sensed as well.

In the circuit of JP 2002-300020A, however, the threshold voltage on the p-type MOS transistor has a temperature dependence. Due to variance factors including such the temperature dependence, a problem arises because an output timing of a power-off signal to sense the drop in the supply voltage varies.

SUMMARY OF THE INVENTION

In one aspect the present invention provides a supply voltage sensing circuit sensing a variation in a supply voltage, comprising: an internal power supply circuit providing a constant output voltage regardless of the supply voltage; a delay circuit generating a delayed signal by delaying a variation in the output voltage; a divider circuit generating a divided voltage by dividing the supply voltage at a certain division ratio; a p-type MOS transistor having a source given the delayed signal and a gate given the divided voltage and turning on when the supply voltage lowers below a certain value; and an output circuit providing an output voltage based on a drain voltage on the p-type MOS transistor.

DETAILED DESCRIPTION OF THE EMBODIMENTS

The embodiments of the present invention will now be described in detail below with reference to the drawings.

First Embodiment

Figure 1:
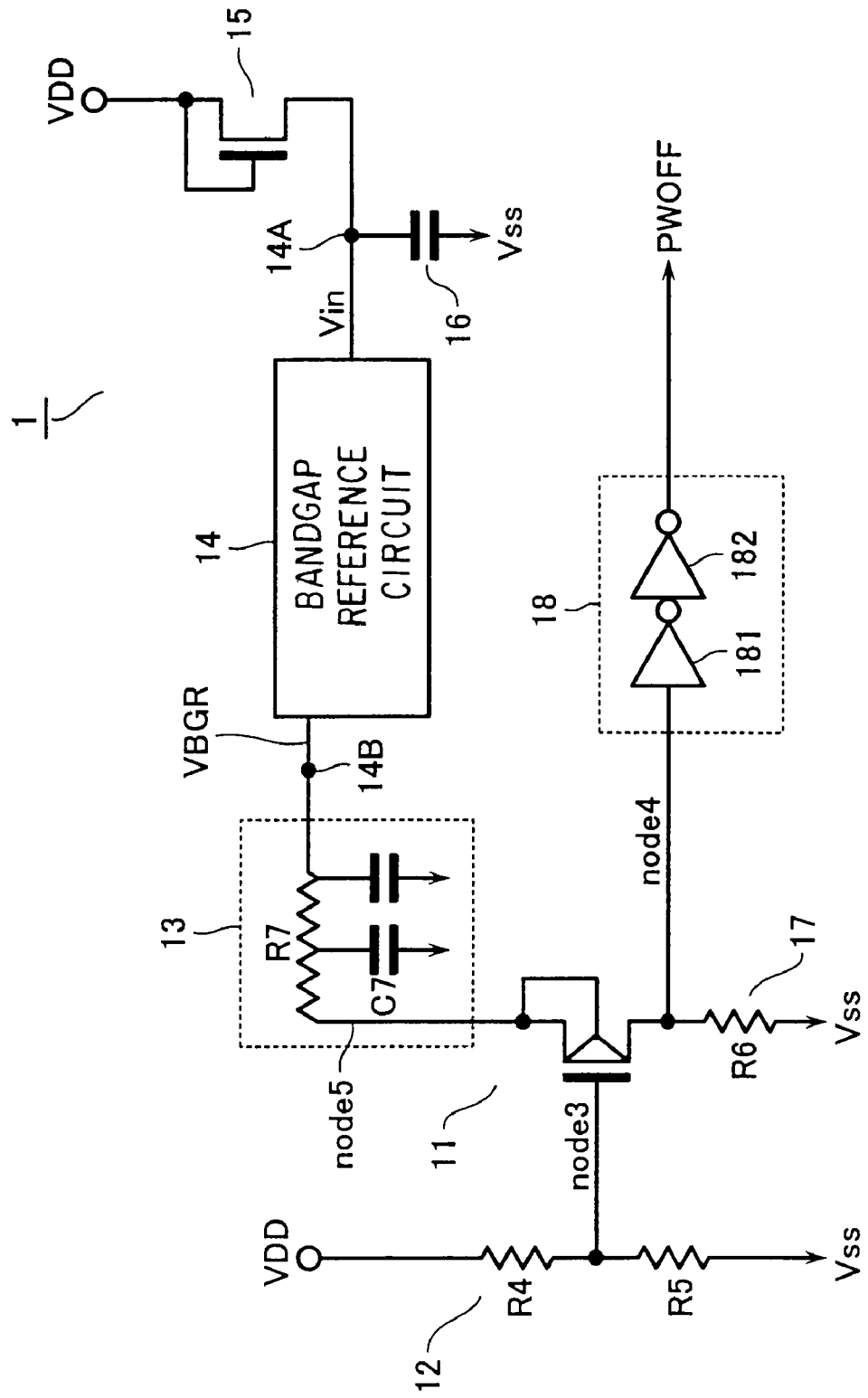
FIG. 1 shows an arrangement of a supply voltage sensing circuit 1 according to a first embodiment of the present invention.

FIG. 1 shows an arrangement of a supply voltage sensing circuit 1 according to a first embodiment of the present invention. The supply voltage sensing circuit 1 is a circuit to sense that a supply voltage Vcc drops below a certain value, and includes a p-type MOS transistor 11. The p-type MOS transistor 11 is a normally-off transistor having a negative threshold voltage Vth.

The p-type MOS transistor 11 has a gate, which is connected to a resistance divider circuit 12 including a resistor 12A (resistance value of R4) and a resistor 12B (resistance value of R5) serially connected. The gate of the p-type MOS transistor 11 is connected to a node 3 between the resistors 12A and 12B. The other end of the resistor R4 is given the supply voltage VDD to be detected while the other end of the resistor R5 is given the ground potential Vss. Thus, the node 3 or the gate of the p-type MOS transistor 11 is supplied with a potential VDD×R5/(R4+R5).

The p-type MOS transistor 11 has a source, which is connected to a RC delay circuit 13 including a resistor R7 and a capacitor C7. A bandgap reference circuit (BGR circuit) 14 serving as an internal power supply circuit is connected upstream to the delay circuit. The BGR circuit 14 has an input terminal, which is connected to a diode-connected, n-type MOS transistor 15.

The transistor 15 has a drain, which is given the supply voltage VDD to be detected. Between the source and the ground potential Vss, a stabilizing capacitor 16 is connected to pool charges thereon. The BGR circuit 14 has characteristic values of its various internal elements that are set such that the output voltage lowers as the temperature elevates, that is, the circuit has a negative temperature characteristic. In consideration of the temperature characteristic of the p-type MOS transistor 11 as to the absolute value of the threshold voltage Vth, the negative temperature characteristic of the BGR circuit 14 is determined to have a gradient so that it can cancel out variations in the temperature characteristic of the p-type MOS transistor 11.

Between the drain of the p-type MOS transistor 11 and the ground terminal, a current control resistor 17 (resistance value of R6) is connected to limit the current flowing in the p-type MOS transistor 11 when it is turned on. A node 4 on the drain side of the current control resistor 17 is connected to an inverter circuit (output circuit), which includes two-stage inverters 181, 182 and provides an output signal or a power-off signal PWOFF indicating that the supply voltage VDD drops below a certain value.

Figure 2:
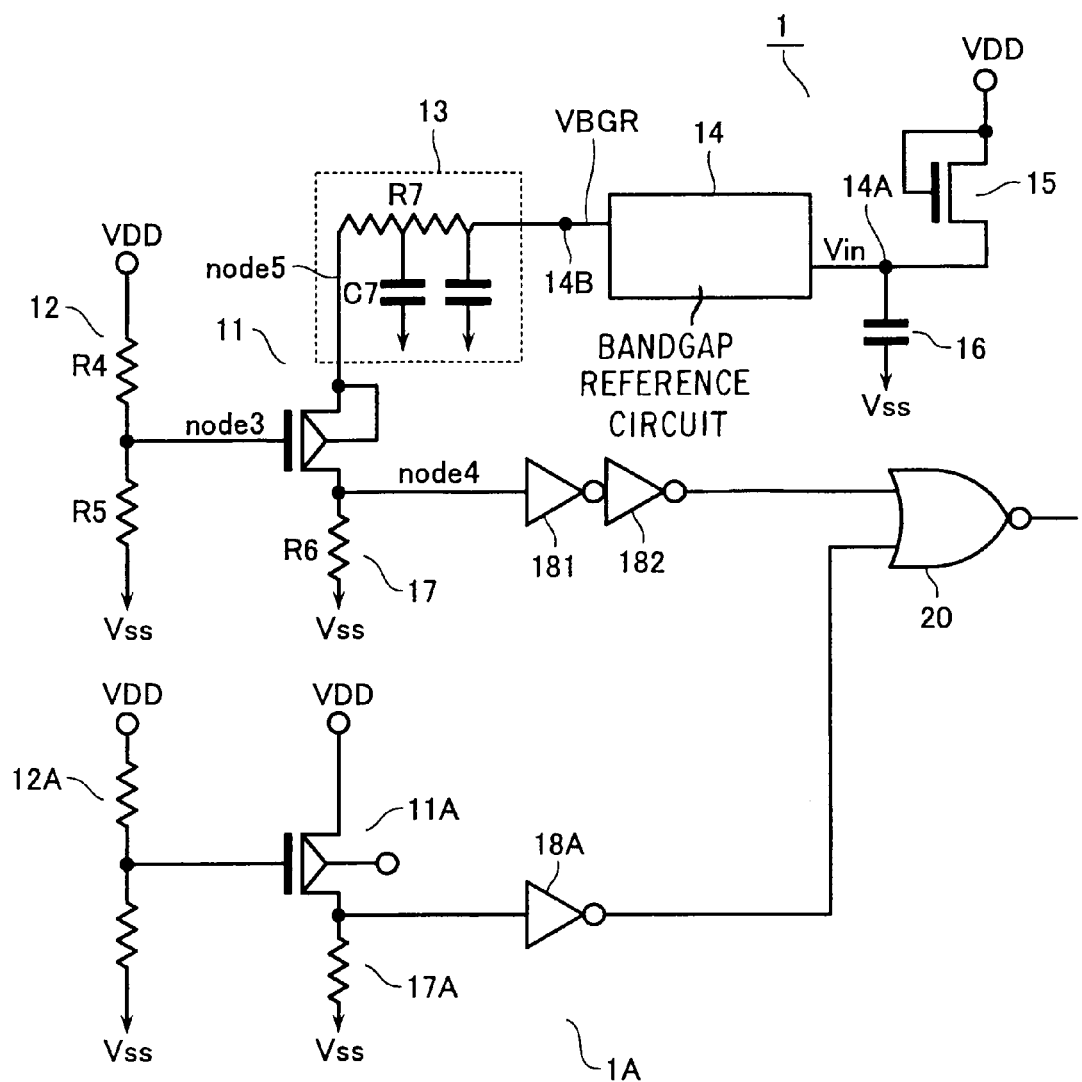
FIG. 2 shows an application example of the supply voltage sensing circuit 1 of FIG. 1.

Sensing that the supply voltage VDD rises above a certain value may be executed in a supply voltage sensing circuit 1A separately used as shown in FIG. 2. A NOR gate 20 is arranged to provide a logical sum of the detection signal from the circuit 1A and the detection signal from the circuit 1 shown in FIG. 1 to sense both the rise and the drop in the supply voltage. The supply voltage sensing circuit 1A itself is publicly known in the above JP2002-300020A and the like and has components similar to the supply voltage sensing circuit of FIG. 1 except that a p-type MOS transistor 1A has a source directly connected to the supply voltage VDD. Therefore, such components are given a subscript "A" in FIG. 2 and omitted from the following detailed description.

Figure 3:
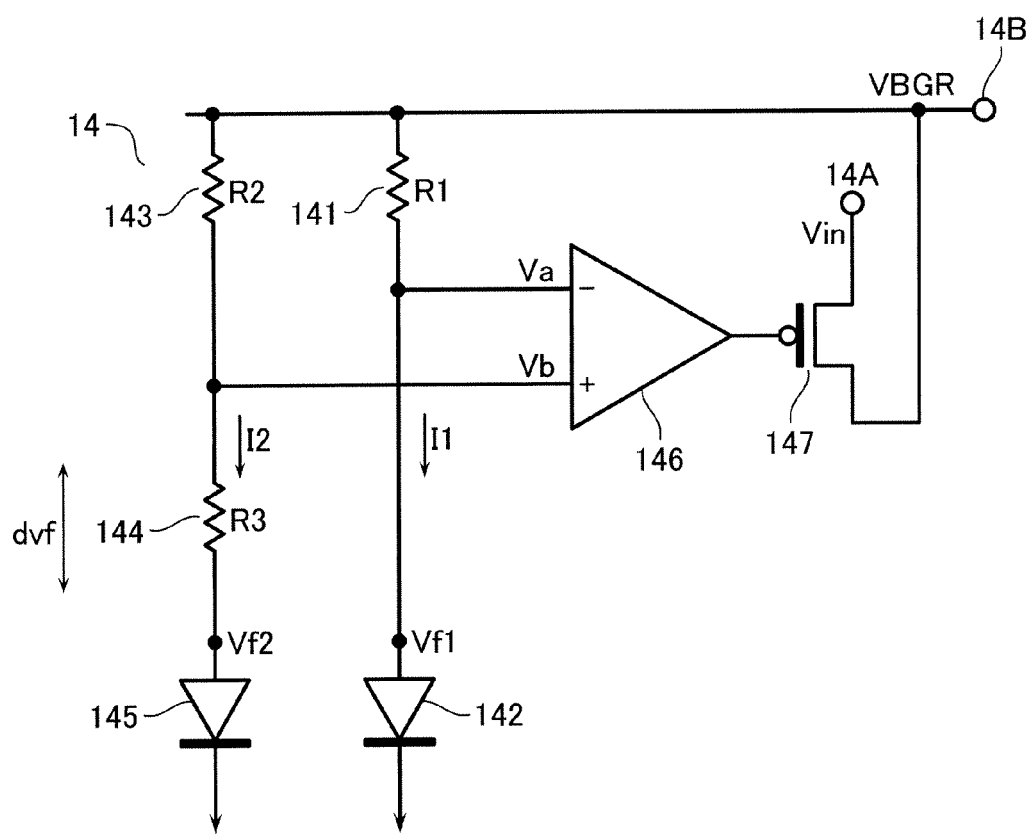
FIG. 3 is a circuit diagram illustrative of an arrangement example of the bandgap reference circuit 14 of FIG. 1.

A specific arrangement of the BGR circuit 14 of FIG. 1 is shown in FIG. 3. The BGR circuit 14 has a first current path including a resistor 141 (resistance value of R1) and a diode 142 serially connected between the output terminal 14B and the ground potential Vss. It also has a second current path including a resistor 143 (resistance value of R2), a resistor 144 (resistance value of R3) and a diode 145 serially connected between the output terminal 14B and the ground potential Vss as well. The diode 145 has an N-fold area compared to the diode 142.

The BGR circuit 14 includes an operational amplifier 146, and an n-type MOS transistor 147. The operational amplifier 146 has anon-inverting input terminal connected to anode between the resistors 143 and 144 and an inverting input terminal connected to a node between the resistor 141 and the diode 142. The operational amplifier 146 compares an input voltage Va on the inverting input terminal with an input voltage Vb on the non-inverting input terminal and controls the output voltage such that both input voltages become equal.

The p-type MOS transistor 147 has a gate connected to the output terminal of the operational amplifier 146. The p-type MOS transistor 147 has a drain used as an input terminal 14A of the BGR circuit 14 and supplied with an input voltage Vin, and a source connected to the output terminal 14B.

In FIG. 2, when the current in the first current path and the current in the second current path are denoted with I1 and I2, respectively, then I1 and I2 can be represented by:

$$I1 = Is \times \exp(q \times Vf1/(k \cdot T))$$

$$I2 = N \times Is \times \exp(q \times Vf2/(k \cdot T))$$ [Expression 1]

where Is denotes a backward-direction saturation current in the diode 142, 145; Vf1 and Vf2 denote respective forward-direction voltages of the diodes 142, 145; k denotes the Boltzmann constant; T denotes an absolute temperature; and q denotes the charge on an electron.

A replacement of VT=k×T/q yields the following.

$$Vf1 = VT \times \log(I1/Is)$$ [Expression 2]

$$Vf2 = VT \times \log(I2/(N \cdot Is))$$
$$= VT \times \log(I1/(N \cdot Is) \times R1/R2)$$

In this case, I1×R1=I2×R2 can be established in the BGR circuit 14. Therefore, a potential difference dVf applied between both terminals of the resistor 144 (resistance value of R3) can be represented by:

$$dVf = Vf1 - Vf2 = VT \times \text{Log}(N \times R2/R1)$$ [Expression 3]

A potential difference applied between both terminals of the resistor 141 (resistance value of R1) and resistor 143 (resistance value of R2) can be represented by R2/R3×dVf. Therefore, the output voltage VBGR from the BGR circuit 14 can be represented by:

$$VBGR = Vf1 + R2/R3 \times dVf$$ [Expression 4]
$$= Vf1 + R2/R3 \times VT \times \log(N \times R2/R1)$$

Vf1 has a temperature characteristic of −2 [mV/° C.] while VT has a temperature characteristic of +0.086 [mV/° C.]. Accordingly, depending on the selection of the resistances R1, R2, R3, the gradient of the temperature characteristic curve of the output voltage VGBR can be adjusted either positive or negative. In this embodiment, the temperature characteristic of the p-type MOS transistor 11 as to the absolute value of the threshold voltage Vth has a negative gradient (the absolute value of the threshold voltage Vth decreases as the temperature elevates) as described above. In consideration of this fact, the resistances R1, R2, R3 are adjusted such that the output voltage VBGR from the BGR circuit 14 has a negative temperature characteristic.

Figure 4:
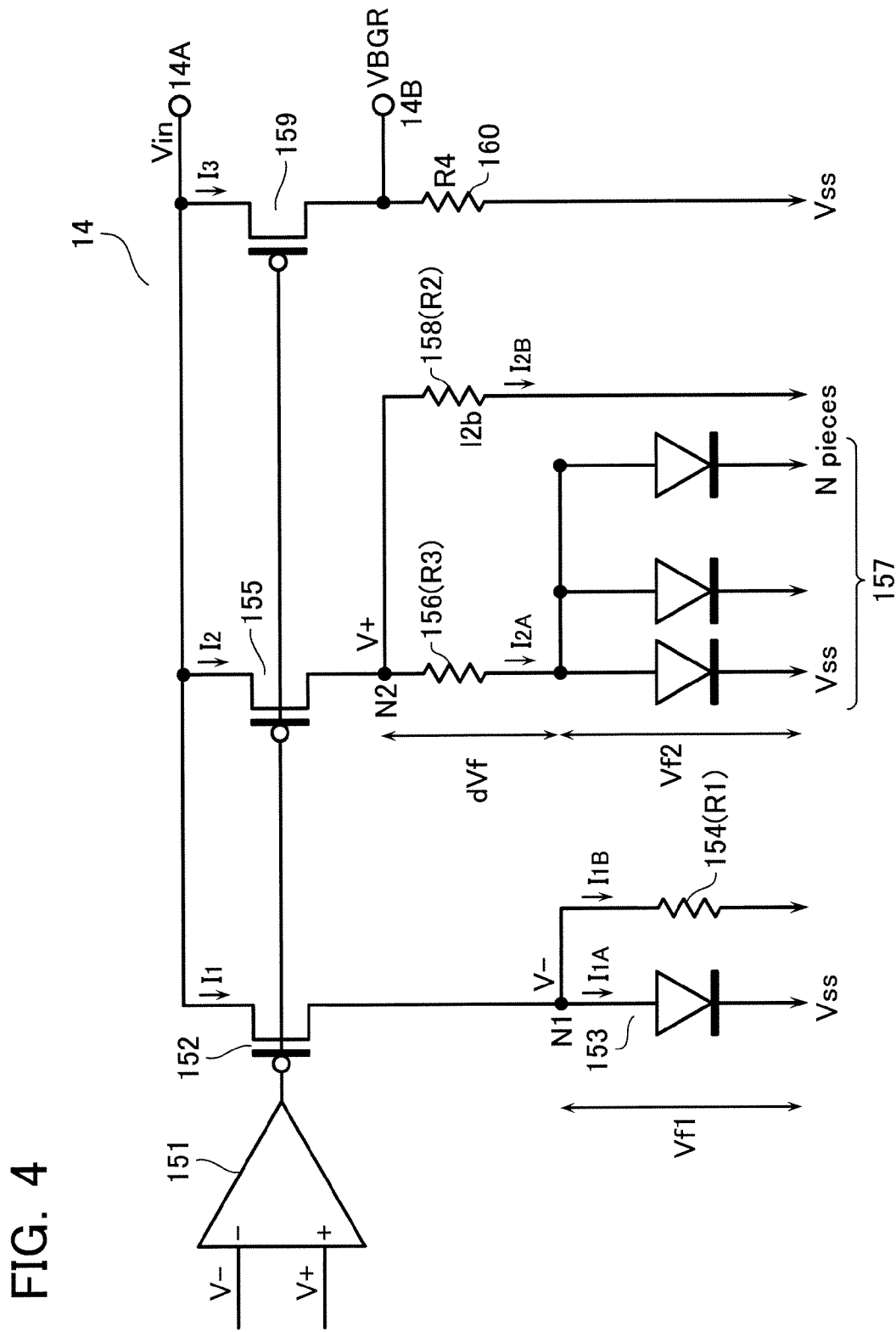
FIG. 4 is a circuit diagram illustrative of another arrangement example of the bandgap reference circuit 14 of FIG. 1.

Another specific arrangement of the BGR circuit 14 is shown in FIG. 4. The BGR circuit 14 includes an operational amplifier 151. Between the input terminal 14A and the ground potential Vss, a first current path is formed including a p-type MOS transistor 152, a diode 153, and a resistor 154 (resistance value of R1) connected in parallel with the diode.

In parallel with the first current path, a second current path is formed including a p-type MOS transistor 155, a resistor 156 (resistance value of R3), N pieces of parallel-connected diodes 157, and a resistor 158 (resistance value of R2) connected in parallel with the resistor 156 and diodes 157. In parallel with the first and second current paths, a third current path is similarly formed including a p-type MOS transistor 159, and a resistor 160 (resistance value of R4).

The transistors 152, 155 and 159 are equally sized transistors, which have gates commonly connected to the output terminal of the operational amplifier 151 to form a current mirror circuit. This circuit allows currents I1, I2, and I3 (I1=I2=I3) with the same value to flow in the first, second and third current paths. As a result, the potential on a node N1 between the transistor 152 and the diode 153 and the potential on a node N2 between the transistor 155 and the resistor 156 (V+, V−) become equal. A node between the transistor 159 and the resistor 160 is used as an output terminal to provide the output voltage VBGR from the BGR circuit 14.

The potential on the node N1 is fed to the inverting input terminal of the operational amplifier 151 and the potential on the node N2 is fed to the non-inverting input terminal of the operational amplifier 151.

In this case, the current flowing in the diode 153 is denoted with I1A while the current flowing in the resistor 154 is denoted with I1B (I1=I1A+I1B). The current flowing in the resistor 156 is denoted with I2A while the current flowing in the diode 158 is denoted with I2B (I2=I2A+I2B). When R1=R2, the following expression is derived.

$$I1A = I1B$$

$$I2A = I2B$$

$$V- = Vf1$$

$$V+ = Vf2 + dVf$$

$$dVf = Vf1 - Vf2 \quad \text{[Expression 5]}$$

The voltage across both ends of the resistor 156 is dVf. Accordingly, the following is given.

$$I2A = dVf/R3$$

$$I2B = Vf1/R2 \quad \text{[Expression 6]}$$

Therefore, the following can be represented.

$$I2 = I2A + I2B = Vf1/R2 + dVf/R3 \quad \text{[Expression 7]}$$

Therefore, the following can represent the output voltage VGBR.

$$VBGR = R4 \times (Vf1/R2 + dV/R3) \quad \text{[Expression 8]}$$
$$= R4 \times (Vf1/R2 + VT/R3 \times \log N)$$

Vf1 has a temperature characteristic of −2 [mV/° C.] while VT has a temperature characteristic of +0.086 [mV/° C.]. Accordingly, depending on the selection of the resistances R2, R3, the gradient of the temperature characteristic curve of the output voltage VGBR can be adjusted either positive or negative. In accordance with the negative gradient of the temperature characteristic of the p-type MOS transistor 11 as to the absolute value of the threshold voltage Vth, the resistances R2, R3 can be adjusted also in the circuit of FIG. 4 such that the output voltage VBGR from the BGR circuit 14 has a negative temperature characteristic.

Figure 5:
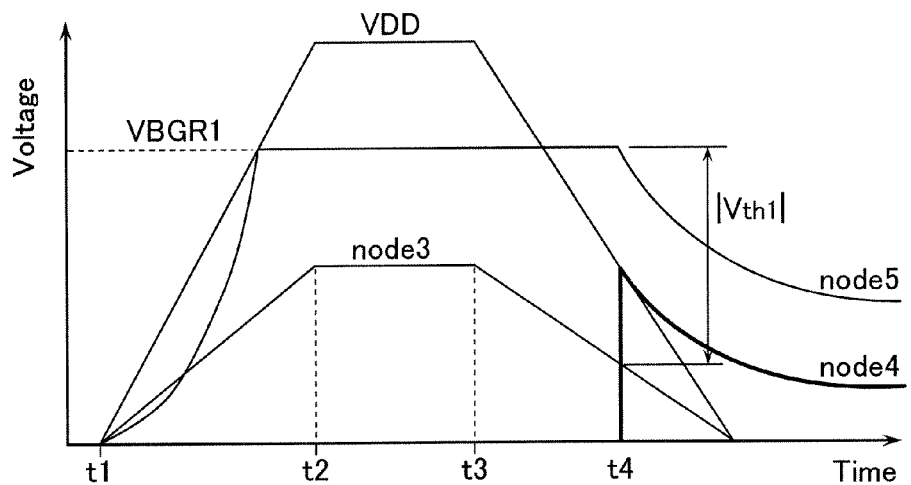
FIG. 5 is a graph illustrative of operation of the supply voltage sensing circuit 1 of the first embodiment.
Figure 6:
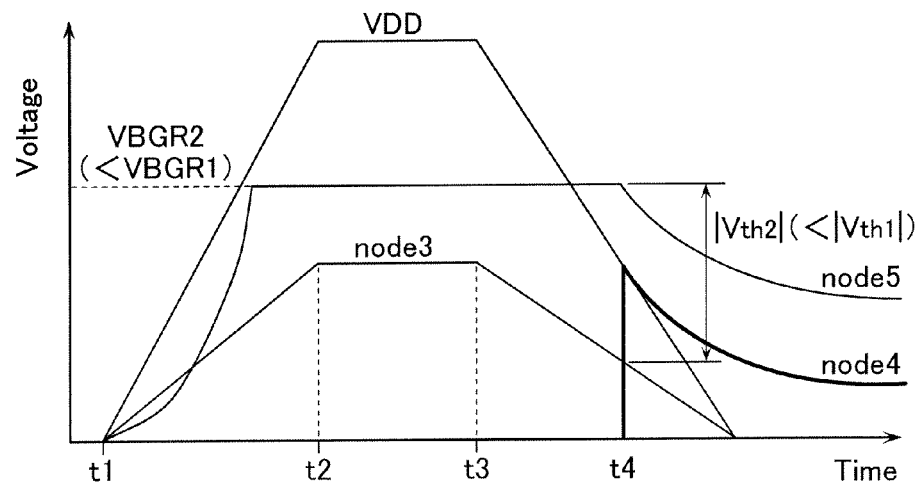
FIG. 6 is a graph illustrative of operation of the supply voltage sensing circuit 1 of the first embodiment 1.

Operation of the supply voltage sensing circuit 1 according to the first embodiment is described with reference to FIGS. 5 and 6. FIG. 5 shows an example of variations in voltage on the each node in response to variations in the supply voltage VDD at a temperature T=T1. FIG. 6 shows an example of variations in voltage on the each node in response to variations in the supply voltage VDD at a temperature T=T2 higher than T1.

In the case of the temperature T=T1 (FIG. 5), the supply voltage VDD starts at time t1 to rise gradually from zero and reaches a steady-state value at time t2. On the other hand, the output voltage VBGR from the BGR circuit 14 stabilizes at a constant value VBGR1. In response to this variation, the voltage on the node 5 reaches VBGR1 after a delay of the time constant of the RC delay circuit 13. As the resistance divider circuit 12 has a division ratio of R5/(R4+R5), the voltage on the node 3 varies along a slow gradient due to the division ratio during the rise/drop in VDD and reaches R5/(R4+R5)× VDD at the time of steady state. Sensing that the supply voltage VDD rises above a certain value is executed in another supply voltage sensing circuit 1A shown in FIG. 2.

As the supply voltage VDD starts at time t3 to lower gradually from the steady-state value, the voltage on the node 3 also starts to lower almost at the same time. However, the input voltage Vin is kept at near VDD for a while by the stabilizing capacitor 16. Accordingly, the output voltage VBGR from the BGR circuit 14 remains almost VBGR1 subsequently and the voltage on the node 5 is held at about VBGR1.

In this way, the voltage on the node 5 is held at VBGR1 while the voltage on the node 3 lowers almost in synchronization with the decrease in the supply voltage. Accordingly, when the potential difference between both voltages at time t4 exceeds the absolute value |Vth| of the threshold voltage Vth1 at the temperature T=T1 of the p-type MOS transistor 11, the p-type MOS transistor 11 turns on. Thus, current flows in the current control resistor 17 and charges up a capacitive component thereof to raise the potential on the node 4 fast accordingly. As a result, the power-off signal PWOFF switches near time t4 from "L" to "H", which indicates that a drop in the supply voltage VDD below a certain value is sensed.

If the temperature T is equal to T2 higher than T1 (T2 >T1), the absolute value of the threshold voltage Vth2 of the p-type MOS transistor 11 becomes equal to |Vth2| (<|Vth1|), which is lower than |Vth1| at T=T1. Therefore, if the voltage on the node 5 at T=T1 is equal to that at T=T2, the output timing of the power-off signal PWOFF varies and prevents accurate supply voltage sensing.

In the present embodiment, therefore, the resistances of the internal resistors (such as the resistors 141, 143, 144 in FIG. 3) are set as described above such that the output voltage VBGR from the BGR circuit 14 has a negative temperature characteristic. Namely, compared to the output voltage VBGR1 from the BGR circuit 14 at T=T1, the output voltage VBGR2 at T=T2 is made lower. It is suitable if a difference between VBGR1 and VBGR2 meets the difference between the thresholds of the p-type MOS transistor 11. Thus, the present embodiment makes it possible to cause no variation in the output timing of the power-off signal based on the temperature dependence and to provide the power-off signal in the presence of a constant supply voltage. Accordingly, it is possible to execute accurate supply voltage sensing.

Second Embodiment

An arrangement of a supply voltage sensing circuit 1B according to a second embodiment of the present invention is described next with reference to FIG. 7. The same components in FIG. 7 as those in FIG. 1 are denoted with the same reference numerals and omitted from the following duplicated description.

Figure 7:
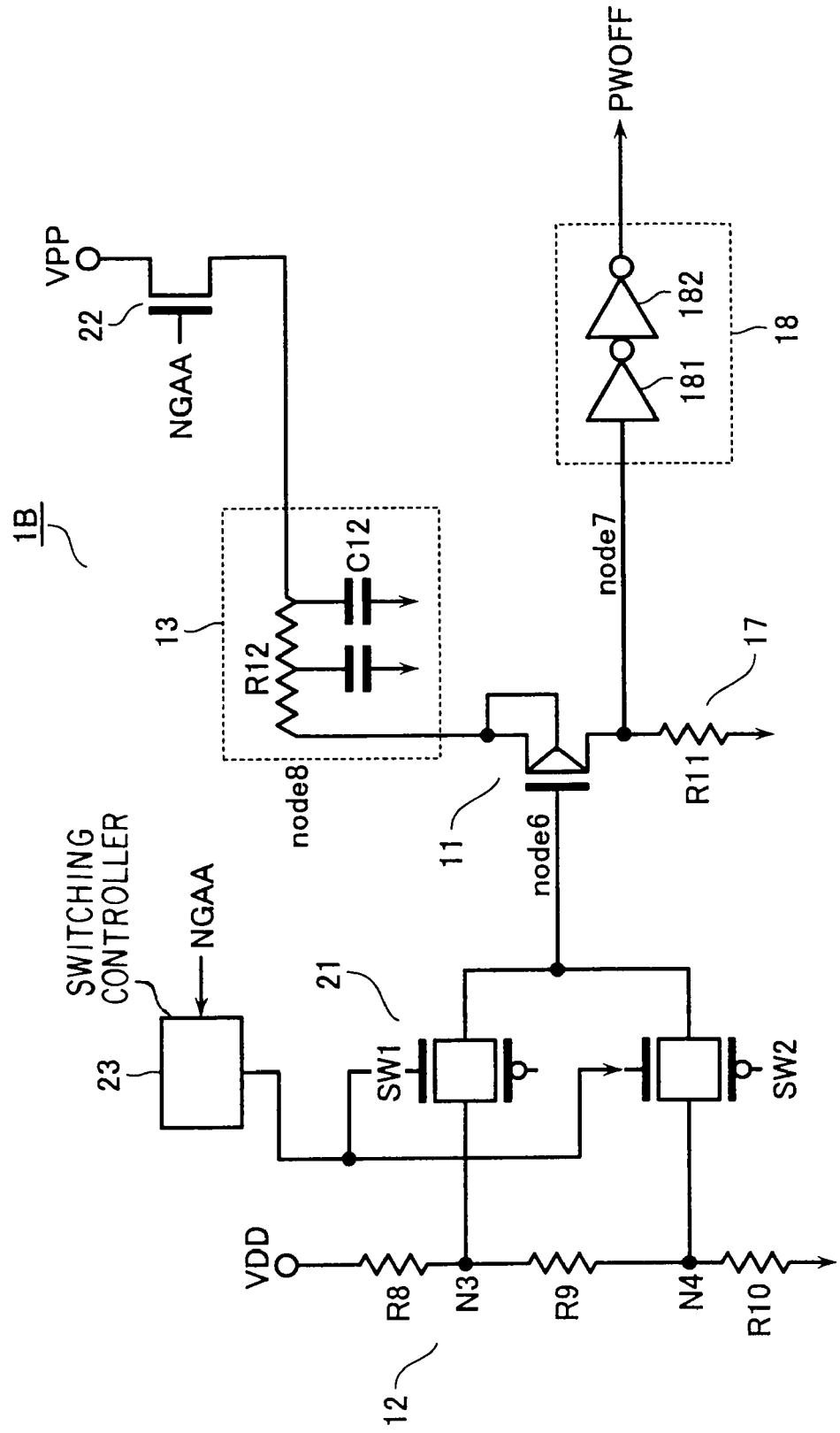
FIG. 7 shows an arrangement of a supply voltage sensing circuit 1B according to a second embodiment of the present invention.

In the supply voltage sensing circuit 1B of FIG. 7, an n-type, stepdown transistor 22, which is used in an internal power supply circuit inside a semiconductor memory device, is provided, instead of the BGR circuit 14, to configure an internal power supply circuit. The stepdown transistor 22 has a drain supplied with a boosted voltage VPP, which is applied, for example, to a word line of a ferroelectric memory.

On the other hand, the gate thereof is supplied with a gate potential NGAA on a source-follower stepdown transistor that generates an internal supply potential VAA for use in a ferroelectric memory, while the source thereof is connected to the RC delay circuit 13. The boosted voltage VPP can be generated in a booster circuit, not shown, by boosting the supply voltage VDD. It is an example of another voltage that varies with delay compared to a variation in the supply voltage VDD.

Figure 8:
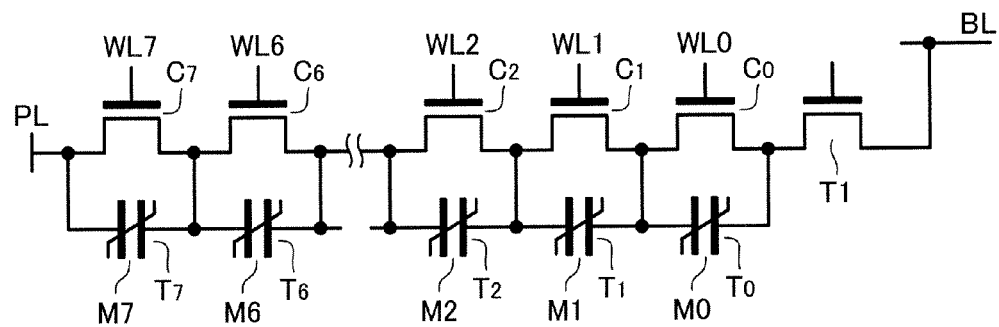
FIG. 8 illustrates an arrangement of a ferroelectric memory of a TC parallel unit series-connection type.

FIG. 8 shows an arrangement of a memory unit in a ferroelectric memory of a TC parallel unit series-connection type. This ferroelectric memory configures a memory unit structured such that a plurality (eight in FIG. 8) of memory cells Mj are serially connected. One memory cell Mj is structured to include one transistor Tj and one ferroelectric capacitor Cj connected in parallel.

In the ferroelectric memory, all word lines WLj are kept at the boosted voltage VPP ("H") in standby state to hold both ends of the ferroelectric capacitor Cj short-circuited. In this state, the word line of a selected memory cell is set at 0 V ("L") and a plate line PL is driven to perform reading and writing. As all word lines WLj are kept at the boosted voltage VPP in standby state, and the ferroelectric memory has a large gate capacitance, the boosted voltage VPP can be retained at a higher voltage for a while even after the supply voltage VDD sharply drops.

This arrangement allows the boosted voltage VPP to fall slowly even if the supply voltage VDD sharply drops, and the variation is further delayed through the RC delay circuit 13. Therefore, the potential on the node 8 can be maintained almost constant even after the sharp drop in VDD.

The circuit of this embodiment comprises a switching circuit 21. The switching unit 21 includes a plurality of transfer gates SWj (two in FIG. 7: SW1, SW2). Each transfer gate SWj is connected to a node between a plurality of resistors (three in FIG. 7: R8, R9, R10) in the resistance divider circuit 12. The transfer gates SW1, SW2 are switching-controlled by a switching controller 23.

Trimming is required to vary the internal supply voltage VAA. Therefore, trimming is also required to vary the gate voltage NGAA on the source-follower stepdown transistor for generating the internal supply potential VAA. If the gate voltage NGAA varies through trimming, the potential on the source (node 8) of the p-type MOS transistor 11 also varies, and inevitably the potential on the node 6 used to turn on the p-type MOS transistor varies.

Accordingly, in order to turn on the p-type MOS transistor 11 in the presence of the same supply voltage VDD at all times even if the gate voltage NGAA is varied through trimming, the switching unit 21 must be switched in response to the variation in the gate voltage NGAA after trimming. Namely, the switching controller 23 senses the level of the gate voltage NGAA and, in accordance with the sensed result, selectively turns on any one of the transfer gates SWi and turns off the others. Namely, the switching unit 21 and the switching controller 23 together serve as a division ratio changing circuit that changes the division ratio of the resistance divider circuit 12.

Figure 9:
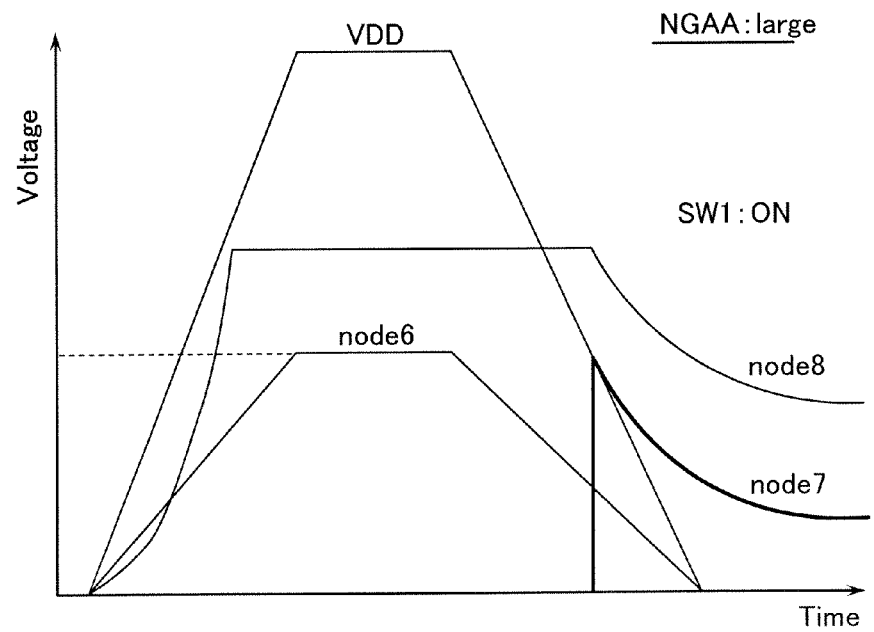
FIG. 9 is a graph illustrative of operation of the supply voltage sensing circuit 1B of the second embodiment.
Figure 10:
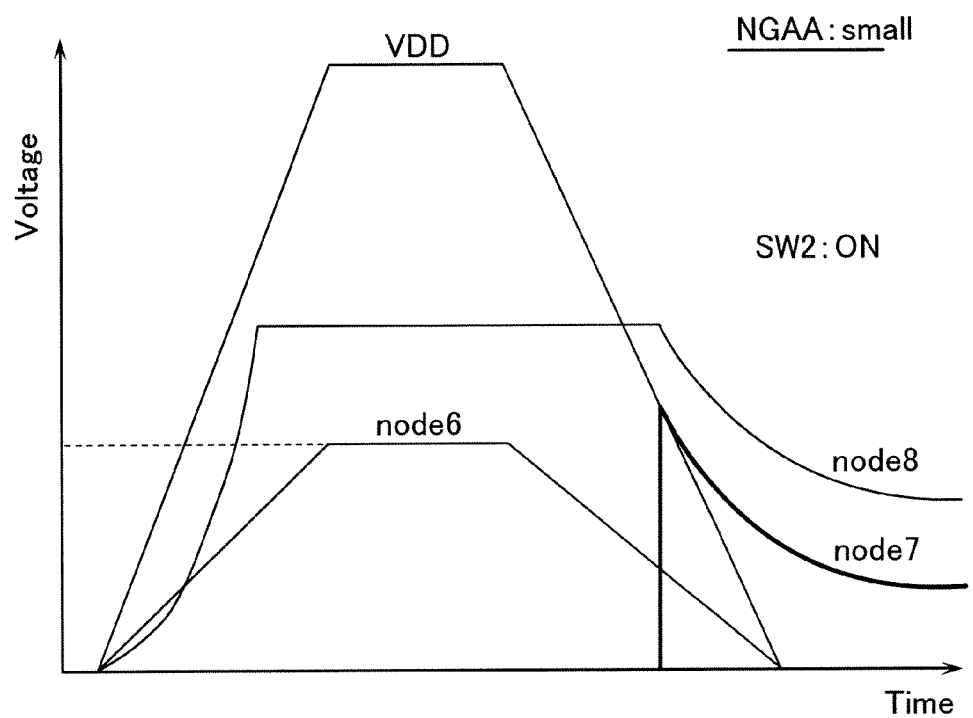
FIG. 10 is a graph illustrative of operation of the supply voltage sensing circuit 1B of the second embodiment.

In accordance with this arrangement, when the gate voltage NGAA is high, only the transfer gate SW1 is turned on to apply a higher voltage to the node 6. On the other hand, when the gate voltage NGAA is low, only the transfer gate SW2 is turned on to lower the voltage on the node 6. This makes it possible to achieve an almost constant potential difference between the nodes 6 and 8 without depending on the level of the gate voltage NGAA as shown in FIGS. 9 and 10. It is also made possible to achieve a constant detection timing of the drop in the supply voltage VDD, and to provide the power-off signal in the presence of the same supply voltage. In this example, the application to the ferroelectric memory of the TC parallel unit series-connection type is described for facilitation of understanding though the circuit is also applicable to other semiconductor memory devices, of course. For example, the boosted voltage VPP may be a boosted voltage that is supplied to a decoder in a flash EEPROM.

The voltage applied to the drain of the stepdown transistor 22 is not required to be the boosted voltage VPP but may be one if it varies in relation to the supply voltage VDD to be sensed and the variation has a delay relative to the variation in VDD.

The embodiments of the present invention have been described above though the present invention is not limited to these embodiments but rather can be given various modifications, replacements, deletions and additions without departing from the spirit and scope of the invention. For example, the switching unit 21 described in the second embodiment (FIG. 7) is not only applied to the case of FIG. 7 that uses the stepdown transistor 22 as the internal power supply circuit. It is also applicable to supply voltage sensing circuits that use other internal power supply circuits.

What is claimed is:

1. A supply voltage sensing circuit sensing a variation in a supply voltage, comprising:

an internal power supply circuit providing a first output voltage that is constant regardless of said supply voltage;

a delay circuit generating a delayed signal by delaying a variation in said first output voltage;

a first divider circuit generating a first divided voltage by dividing said supply voltage at a certain division ratio;

a first p-type MOS transistor having a source given said delayed signal and a gate given said first divided voltage and turning on when said supply voltage lowers below a certain value;

a first output circuit providing a second output voltage based on a drain voltage of said first p-type MOS transistor;

a second divider circuit generating a second divided voltage by dividing said supply voltage at a certain division ratio;

a second p-type MOS transistor having a source given said supply voltage and a gate given said second divided voltage and turning on when said supply voltage rises above a certain value; and a second output circuit providing a third output voltage based on a drain voltage of said second p-type MOS transistor;

said internal power supply circuit comprising a bandgap reference circuit, with a temperature characteristic that lowers the first output voltage as the temperature elevates.

2. The supply voltage sensing circuit according to claim 1, wherein said temperature characteristic is determined to cancel out a variation in said first output voltage caused by the temperature characteristic of said first p-type MOS transistor as to the absolute value of the threshold voltage of said p-type MOS transistor.

3. The supply voltage sensing circuit according to claim 1, further comprising a stabilizing capacitor connected to the input terminal of said bandgap reference circuit to stabilize the input voltage on said input terminal.

4. The supply voltage sensing circuit according to claim 1, further comprising a division ratio changing circuit changing said division ratio of said first divider circuit.

5. A supply voltage sensing circuit, sensing a variation in a supply voltage, comprising:
- an internal power supply circuit providing a first output voltage that is constant regardless of said supply voltage;
- a delay circuit generating a delayed signal by delaying a variation in said first output voltage;
- a first divider circuit generating a first divided voltage by dividing said supply voltage at a certain division ratio;
- a first p-type MOS transistor having a source given said delayed signal and a gate given said first divided voltage and turning on when said supply voltage lowers below a certain value;
- a first output circuit providing a second output voltage based on a drain voltage of said first p-type MOS transistor;
- a second divider circuit generating a second divided voltage by dividing said supply voltage at a certain division ratio;
- a second p-type MOS transistor having a source given said supply voltage and a gate given said second divided voltage and turning on when said supply voltage rises above a certain value; and
- a second output circuit providing a third output voltage based on a drain voltage of said second p-type MOS transistor;
- said internal power supply circuit includes a stepdown transistor having one end, which is supplied with a first input voltage that varies with delay compared to a variation in said supply voltage.

6. The supply voltage sensing circuit according to claim 5, wherein said first input voltage is a voltage generated by boosting said supply voltage and applied to a word line of a ferroelectric memory.

7. The supply voltage sensing circuit according to claim 5, further comprising:
- a division ratio changing circuit changing said division ratio of said first divider circuit; and
- a division ratio controller circuit controlling said division ratio in accordance with a variation in gate voltage on said stepdown transistor.

8. The supply voltage sensing circuit according to claim 1, further comprising a current control resistor connected between said first p-type MOS transistor and the ground potential and limiting the current flowing in said first p-type MOS transistor.

* * * * *